(12) United States Patent
Simoen et al.

(10) Patent No.: US 8,227,299 B2
(45) Date of Patent: Jul. 24, 2012

(54) REMOVAL OF IMPURITIES FROM SEMICONDUCTOR DEVICE LAYERS

(75) Inventors: Eddy Simoen, Ichtegem (BE); Jan Vanhellemont, Schilde (BE)

(73) Assignees: IMEC, Leuven (BE); Umicore, Brussels (BE)

( * ) Notice: Subject to any disclaimer, the term of this patent is extended or adjusted under 35 U.S.C. 154(b) by 256 days.

(21) Appl. No.: 12/434,441

(22) Filed: May 1, 2009

(65) Prior Publication Data

US 2009/0273010 A1  Nov. 5, 2009

Related U.S. Application Data

(63) Continuation of application No. PCT/EP2007/061830, filed on Nov. 2, 2007.

(60) Provisional application No. 60/864,029, filed on Nov. 2, 2006.

(51) Int. Cl.
*H01L 21/335* (2006.01)
*H01L 21/322* (2006.01)

(52) U.S. Cl. ........ 438/143; 438/476; 438/471; 257/913; 257/E21.318

(58) Field of Classification Search .................. 257/913, 257/E21.318; 438/143, 310, 402, 471, 473, 438/475, 476
See application file for complete search history.

(56) References Cited

U.S. PATENT DOCUMENTS

| | | | | |
|---|---|---|---|---|
| 4,556,895 A | * | 12/1985 | Ohata | ............................. 257/351 |
| 5,753,560 A | * | 5/1998 | Hong et al. | ................... 438/402 |
| 6,541,348 B1 | * | 4/2003 | Nakajima | ..................... 438/407 |
| 2003/0027406 A1 | | 2/2003 | Malone | |
| 2004/0235264 A1 | | 11/2004 | Forbes | |
| 2005/0239267 A1 | | 10/2005 | Tobashi | |
| 2006/0175613 A1 | * | 8/2006 | Lee et al. | ........................ 257/65 |

FOREIGN PATENT DOCUMENTS

| | | |
|---|---|---|
| EP | 0538682 A2 | 4/1993 |
| GB | 1342627 | 1/1974 |
| WO | WO 2004/099473 A1 | 11/2004 |

OTHER PUBLICATIONS

International Search Report dated Jan. 22, 2008 for PCT/EP2007/061830.

Wang, et al., Molecular beam epitaxial growth and material properties of GaAs and AlGaAs on Si (100), Appl. Phys. Lett., vol. 44, Issue 12, Jun. 15, 1984, American Institute of Physics.

(Continued)

*Primary Examiner* — Evan Pert
*Assistant Examiner* — Scott Stowe
(74) *Attorney, Agent, or Firm* — Knobbe Martens Olson & Bear LLP

(57) ABSTRACT

A method for removing impurities from at least one semiconductor device layer during manufacturing of a semiconductor device is disclosed. The semiconductor device layer has a compound semiconductor material and/or germanium. Each heating process performed during the manufacturing of the semiconductor device after provision of the semiconductor device layer has a low thermal budget determined by temperatures equal to or lower than about 900° C. and time periods equal to or lower than about 5 minutes. In one aspect, the method includes providing a germanium gettering layer with a higher solubility for the impurities than the semiconductor device layer. The germanium gettering layer is provided at least partly in direct or indirect contact with the at least one semiconductor device layer, such that impurities can diffuse from the at least one semiconductor device layer to the germanium gettering layer.

21 Claims, 5 Drawing Sheets

OTHER PUBLICATIONS

Liu, et al., Experimental evidence for dislocation-related gettering in metamorphic InP/InGaAs high electron mobility transistor (HEMT) structures on GaAs substrate, Journal of Applied Physics, vol. 100, 034505, Aug. 2006, American Institute of Physics.

Hall, et al., Diffusion and solubility of copper in extrinsic and intrinsic germanium, silicon, and gallium arsenide, Journal of Applied Physics, vol. 35, No. 2, Feb. 1964.

Vanhellemont, et al., Brother Silicon, Sister Germanium; Journal of the Electrochemical Society, vol. 154, No. 7, H572-H582, May 2007.

* cited by examiner

REMOVAL OF IMPURITIES FROM SEMICONDUCTOR DEVICE LAYERS

CROSS REFERENCE TO RELATED APPLICATIONS

This application is a continuation of PCT Application No. PCT/EP2007/061830, filed Nov. 2, 2007, which claims priority under 35 U.S.C. §119(e) to U.S. provisional patent application 60/864,029 filed on Nov. 6, 2006. Each of the above applications is incorporated by reference hereby in its entirety.

BACKGROUND OF THE INVENTION

1. Field of the Invention

The present invention relates to a method for removing impurities from at least one semiconductor device layer during manufacturing of a semiconductor device using such a device layer, the at least one semiconductor device layer comprising a compound semiconductor material and/or germanium, to a method for forming a semiconductor device using the method for removing impurities according to embodiments of the invention and to semiconductor devices thus obtained.

2. Description of the Related Technology

In state of the art semiconductor processing, novel materials have been introduced in the past years. Although silicon remains one of the main semiconductor materials for many applications, other materials have gained more interest. For example, germanium and II-VI and III-V materials have been introduced as materials which can advantageously be compared to silicon in terms of electrical or physical characteristics for dedicated applications. These materials can be used in various types of electronic and photonic systems, such as e.g. solar cells, light emitting diodes (LED), spin-electronics and quantum-well devices, III-V based field effect transistors (FET), III-V based heterojunction devices such as heterojunction bipolar transistors (HBT), III-V based high electron mobility transistors (HEMT) and high frequency devices or high power devices.

As II-VI and III-V semiconductor materials are formed by a combination of elements from different groups of the periodic table they are often referred to as compound semiconductors. Examples of such compound semiconductors may be (1) a combination of group III elements (B, Al, Ga, In) and group V elements (N, P, As, Sb, Bi) for compounds such as AlN, AlP, AlAs, GaN, GaP, GaAs, InP, InAs, InSb, AlInGaP, AlGaAs etc, or (2) a combination of group II elements (Zn, Cd, Hg) and group VI elements (O, S, Se, Te) for compounds such as ZnS, ZnSe, ZnTe, CdTe, HgTe, CdHgTe etc.

In manufacturing of semiconductor devices, contamination, more particularly metal contamination, is a well-known problem. The manufacturing of a semiconductor device is inevitably accompanied by inadvertent contamination, mainly by fast diffusing metals such as e.g. Cu, Fe, Ni, Co, which may be present in materials used during the manufacturing process when, for example, forming high-k gate dielectrics, a metal gate electrode or silicides. These contaminants may contaminate the semiconductor device layers and deteriorate the performance and reliability of the semiconductor device. For a given process flow for manufacturing semiconductor devices the presence of such contaminants in a semiconductor material which is part of the device, even in minute quantities, may determine the degree of performing performance of the semiconductor device. As silicon-based and III-V based devices are often fabricated in a same process flow, contaminants present in a layer of one material may contaminate layers formed in the other material. Therefore the impact of such contaminants on all semiconductor materials present in the process flow should be taken into account.

In silicon-based fabrication technology, methods are proposed in which these contaminants are trapped or neutralized so as to eliminate or substantially reduce their impact on the device performance and consequently to substantially reduce their impact on the yield of the fabrication process.

United States application US 2005/0239267 discloses a substrate manufacturing method for forming a substrate, e.g. a silicon-on-insulator (SOI), Ge, GaAs, AlGaAs or InP substrate, before using this substrate to fabricate semiconductor devices. A stack is formed of a gettering layer on an exposed surface of a first, e.g. silicon substrate which is bonded to an insulating layer, e.g. oxide layer, of a second, e.g. silicon substrate. By heating this stack impurities will diffuse from the first substrate towards the gettering layer. Thereafter the gettering layer is removed and the substrate, e.g. SOI substrate is fabricated. However, this method does not allow gettering impurities during the process of fabricating a semiconductor device.

United States application US 2004/0235264 discloses a method for creating gettering sites, i.e. sites for trapping contaminants, in a SOI (silicon-on-insulator) substrate. Relaxed silicon germanium regions are formed in the proximity of the device regions comprising a silicon-based device. These relaxed silicon germanium regions will generate defects which getter impurities from the adjacent silicon region. Although this method allows gettering contaminants during the process of manufacturing the semiconductor device, it doesn't allow gettering contaminants from semiconductor layers containing germanium or compound semiconductor materials because the thermal budget of the overall fabrication process of a semiconductor device using such germanium or compound semiconductor materials may be more limited compared to mainstream silicon technology.

United States application US 2003/0027406 discloses a method to getter impurities, in particular dopants, from a silicon device layer. A silicon-germanium layer with a germanium content of between 0% and 100% is formed in contact with the silicon device layer such that lattice defects like dislocations are created in the contact region. These defects will getter the impurities from the adjacent silicon layer. Although this method allows gettering impurities during the process of fabricating the semiconductor device (at high temperatures e.g. temperatures higher than 600° C.), it doesn't allow gettering of impurities from semiconductor layers containing germanium or compound semiconductor materials because the thermal budget of the overall fabrication process of a semiconductor device using such germanium or compound semiconductor materials may be more limited compared to mainstream silicon technology.

In "Experimental evidence for dislocation-related gettering in metamorphic InP/InGaAs high electron mobility transistor (HEMT) structures on GaAs substrate", Journal of Applied Physics 100 (2006), 034505, Yuwei Liu et al. describe the use of a InGaAs gettering layer for gettering impurities from an InP layer. A dislocation-related gettering effect is obtained due to the presence of a dislocation network acting as gettering sink.

However, for III-V compound, II-VI compound or germanium-based semiconductor devices no or no efficient method is known to getter, during manufacturing of the semiconductor devices, impurities from device layers comprising III-V or other compound semiconductor materials or germanium. There is a need for methods to getter impurities, in particular metal impurities such as fast-diffusing species such as Fe, Co, Ni, from device layers containing III-V or other semiconductor compound materials or germanium. Hence there is a need to provide a semiconductor device comprising III-V or other semiconductor compound material based semiconductor regions which device can be fabricated with improved yield.

SUMMARY OF CERTAIN INVENTIVE ASPECTS

Certain inventive aspects relate to a good method for removing impurities from at least one semiconductor device layer during manufacturing of a semiconductor device using such a device layer, the at least one semiconductor device layer comprising a compound semiconductor material and/or germanium. Certain inventive aspects relate to a good method for forming a semiconductor device using such a method for removing impurities and to provide semiconductor devices thus obtained.

In one aspect, impurities can be removed from a semiconductor device layer at low thermal budgets. Furthermore, once the impurities are gettered by the gettering layer these impurities may stay in the gettering layer, even during cooling down of a substrate on which the semiconductor device is formed. Moreover once gettered, the gettered impurities will remain in the gettering layer, even if the semiconductor device layer is subsequently subjected to further processing and thermal treatments.

A first aspect relates to a method for removing impurities, e.g. metal impurities from at least one semiconductor device layer during manufacturing of a semiconductor device comprising such a semiconductor device layer, the at least one semiconductor device layer comprising a compound semiconductor material and/or germanium, and each heating process performed during the manufacturing of the semiconductor device after provision of the at least one semiconductor layer having a low thermal budget determined by temperatures equal to or lower than 900° C. and time periods equal to or lower than 5 minutes, the thermal budget of a heating process being defined by the integral of the temperature over the time period of the heating process. The germanium gettering layer may have a higher diffusivity for the impurities, e.g. metal impurities to be gettered than the semiconductor device layer.

The method comprises providing a germanium gettering layer with a higher solubility for the impurities, e.g. metal impurities than the semiconductor device layer, the germanium gettering layer being provided at least partly in direct or indirect contact with the at least one semiconductor device layer, such that impurities, e.g. metal impurities can diffuse from the at least one semiconductor device layer to the germanium gettering layer.

The thermal budget defines the total amount of thermal energy transferred to a substrate comprising a semiconductor device during the given heating process. The thermal budget is proportional to the temperature and duration of the heating process. A low thermal budget is possible even at a very high temperature if the time period of the heating process is very short (can be as short as a few seconds). A thermal budget is characterized not only by its total amount of thermal energy provided, but also by the maximum temperature obtained and by the speed at which the temperature is varied during the heating process. In particular the cooling rate, i.e. the rate at which the temperature is decreased from this maximum temperature, is a parameter in the gettering process according to embodiments of the present invention.

An advantage of a method according to embodiments of the invention is that even at a low thermal budget, the germanium gettering layer is able to getter impurities, e.g. metal impurities from the at least one semiconductor device layer and to keep them from going back to the at least one semiconductor device layer.

With "in direct contact" is meant that no other layers are in between the germanium gettering layer and the semiconductor device layer and that impurities, e.g. metal impurities can go directly from the germanium gettering layer to the semiconductor device layer. With "in indirect contact" is meant that at least one intermediate layer, for example at least one dielectric layer, e.g. oxide layer.

The compound semiconductor material may, for example, be a III-V compound semiconductor material, a II-VI compound semiconductor material or a silicon comprising semiconductor material.

According to embodiments of the invention, the method may furthermore comprise modulating, e.g. increasing, gettering efficiency of the germanium gettering layer.

Modulating, e.g. increasing, the gettering efficiency of the germanium gettering layer may be performed by doping the germanium gettering layer. Doping the germanium gettering layer may be performed such that the germanium gettering layer has a dopant concentration of higher than about 1e17 $cm^{-3}$, for example higher than about 1e18 $cm^{-3}$.

According to embodiments of the invention, doping the germanium gettering layer may be performed by incorporating a p-type dopant such as e.g. Ga, B or In, an n-type dopant such as e.g. Sb, As or P, or a neutral impurity such as e.g. 0, C, Sn or Pb.

According to other embodiments of the invention, modulating e.g. increasing, the gettering efficiency of the germanium gettering layer may be performed by creating stress in the germanium gettering layer, for example, locally creating stress by creating dislocations in the germanium gettering layer.

According to embodiments of the invention, modulating e.g. increasing, the gettering efficiency of the germanium gettering layer may be achieved by creating lattice defects in the germanium gettering layer, e.g. by implantation of He, H or inert species such as Ar therein, or by forming small voids in the gettering layer, e.g. by implantation of H and/or He atoms therein.

The germanium gettering layer can be formed as an amorphous layer, as polycrystalline layer, as a multicrystalline layer or as a single crystalline layer.

Providing a germanium gettering layer may be performed such that the germanium gettering layer is in indirect contact with the semiconductor device layer. According to these embodiments, the method may furthermore comprise providing at least one intermediate layer, for example at least one dielectric layer, e.g. oxide layer, in between the germanium gettering layer and the semiconductor device layer, the at least one intermediate layer, for example at least one dielectric layer, e.g. oxide layer, being such that the impurities, e.g. metal impurities, can diffuse from the semiconductor device layer to the germanium gettering layer through the at least one intermediate layer, for example at least one dielectric layer, e.g. oxide layer.

According to embodiments of the invention, providing a germanium gettering layer may be performed by providing a germanium gettering layer over the complete substrate.

According to other embodiments of the invention, providing a germanium gettering layer may be performed by providing a germanium gettering layer only at selected regions of the substrate.

Providing a germanium gettering layer only at selected regions of the substrate may be performed by patterning a germanium gettering layer covering the complete substrate.

The thickness of the germanium gettering layer may be between about 10 nm and 2 μm. For example, according to embodiments of the invention, the thickness of the germanium gettering layer may be less than about 100 nm.

According to embodiments of the invention, the method may furthermore comprise removing the germanium gettering layer after impurities, e.g. metal impurities have been diffused into the germanium gettering layer.

Removing the germanium gettering layer may be performed during manufacturing of the semiconductor device.

According to other embodiments of the invention, removing the germanium gettering layer may be performed after manufacturing of the semiconductor device.

In a second aspect, a method is provided for forming a semiconductor device. The method may comprise:

providing at least one semiconductor device layer, the at least one semiconductor device layer comprising a compound semiconductor material and/or germanium, and removing impurities, e.g. metal impurities from the at least one semiconductor device layer using the method according to embodiments of the present invention.

According to embodiments of the invention, the semiconductor device may be a transistor, and the method may furthermore comprise:

forming a first and second main electrode in the semiconductor device layer, and providing a control electrode structure comprising a dielectric and a control electrode.

In still a further aspect of the invention, a semiconductor device is provided. The semiconductor device comprises:

a semiconductor device layer, and a germanium gettering layer at least partly in direct or indirect contact with the at least one semiconductor device layer, such that impurities can diffuse from the at least one semiconductor device layer to the germanium gettering layer.

The compound semiconductor material may, for example, be a III-V compound semiconductor material, a II-VI compound semiconductor material or a silicon comprising semiconductor material.

According to embodiments of the invention, the semiconductor device may be a transistor. According to these embodiments, the semiconductor device may furthermore comprise:

a first and second main electrode in the semiconductor device layer, and a control electrode structure comprising a dielectric and a control electrode.

According to embodiments of the invention, the transistor may be a MOSFET transistor comprising a source and drain as first and second main electrode and a gate electrode as control electrode.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

All drawings are intended to illustrate some aspects and embodiments of the present invention. The drawings described are only schematic and are non-limiting. In the drawings, the size of some of the elements may be exaggerated and not drawn on scale for illustrative purposes.

Exemplary embodiments are illustrated in referenced figures of the drawings. It is intended that the embodiments and figures disclosed herein should be considered illustrative rather than restrictive.

Figure 1A:
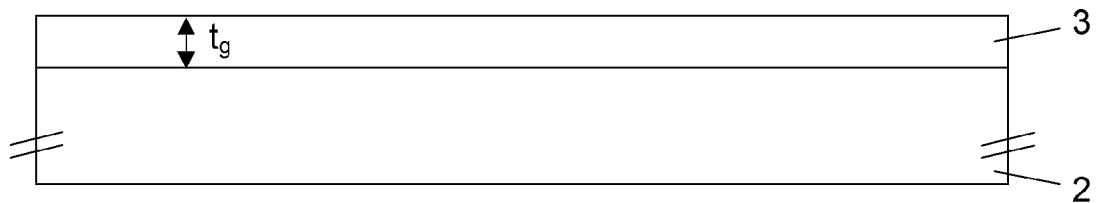
FIGS. 1a to 1c illustrate subsequent processes in a method according to an embodiment of the present invention.

In the different figures, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the terms over, under, underneath and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or processes. It is thus to be interpreted as specifying the presence of the stated features, integers, processes or components as referred to, but does not preclude the presence or addition of one or more other features, integers, processes or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

In the following description, the term "transistor" is intended to refer to a semiconductor device comprising a semiconductor channel region which is dielectrically coupled to a gate electrode via a gate dielectric. The semiconductor channel region is contacted at opposite sides by a source junction and a drain junction. Various types of transistor architectures are already known in the art. In a planar gate device the channel region is only controlled by the gate electrode from one side. Planar gate devices can be formed on a bulk semiconductor substrate or on a semiconductor-on-insulator substrate. For multi-gate devices the channel of the device is controlled by the gate electrode from multiple sides. The body of semiconductor material wherein the channel is formed is made as thin as possible to allow a more efficient control by the gate electrode. For example, the body of a fin-FET may have a thickness in the range of between 10 nm and 100 nm. In 32 nm technology for example the fin width may be in the range of between 10 nm and 20 nm.

In the following description and claims with 'gettering' is meant the process of trapping or neutralizing unwanted elements or impurities, in particular metals, in a semiconductor material.

In the following description and claims, with a 'compound semiconductor material' is meant a semiconductor material composed of elements from two or more different groups of the chemical periodic table, e.g. (1) compounds formed of a combination of elements from group III (B, Al, Ga, In) and group V (N, P, As, Sb, Bi) such as e.g. AlN, AlP, AlAs, GaN, GaP, GaAs, InP, InAs, InSb, AlInGaP, AlGaAs etc, or (2) compounds formed of a combination of elements from group II (Zn, Cd, Hg) and group VI (O, S, Se, Te) such as e.g. ZnS, ZnSe, ZnTe, CdTe, HgTe, CdHgTe etc. Although Si and Ge are elemental (or element) semiconductors, it has to be noted that some Si-based semiconductors that are formed by two elements from a same group (e.g. SiC and SiGe, or in general silicon comprising semiconductor material) are also referred to as compound semiconductor materials in the literature, and are also to be considered as compound semiconductor materials in the light of the present description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

In the following description, embodiments of the invention will be described with reference to a silicon substrate, but it should be understood that the invention also applies to other semiconductor substrates. In embodiments of the invention, the "substrate" may include a semiconductor substrate such as e.g. a silicon (Si), a gallium arsenide (GaAs), a gallium arsenide phosphide (GaAsP), an indium phosphide (InP), a germanium (Ge) or a silicon germanium (SiGe) substrate. The "substrate" may include for example, an insulating layer such as a $SiO_2$ or a $Si_3N_4$ layer in addition to a semiconductor substrate portion. Thus, the term substrate also includes semiconductor-on-insulator substrates such as silicon-on-glass, silicon-on sapphire substrates, silicon-on-insulator (SOI) substrates, germanium-on-insulator substrates (GOI). The term "substrate" is thus used to define generally the elements or layers that underlie a layer or portions of interest. Accordingly, a substrate may be a wafer such as a blanket wafer or may be a layer applied to another base material, e.g. an epitaxial semiconductor layer grown onto a lower layer. The term "crystalline substrate" is intended to include various forms of crystalline material, such as monocrystalline or microcrystalline.

In state-of-the-art semiconductor manufacturing processes the thermal budget of the processes may be limited because a high thermal budget may have a negative impact on diffusion of elements or contaminants such as e.g. dopant redistribution in semiconductor junctions, or on strain relaxation such as e.g. in strain-engineered strain layers. When fabricating semiconductor devices using compound semiconductor materials, for example III-V or II-VI compound semiconductor materials, or germanium, the thermal budget of the overall fabrication process may even be more limited compared to mainstream silicon technology. For activating dopants in compound semiconductor materials, for example III-V compound semiconductor materials, a high temperature is needed. Typically the activation temperature may be lower than 900° C. and may be in the range 700° C. to 900° C. However, this high temperature is only applied for a limited time range, e.g. 10 s to 5 minutes, preferably 10 s to 60 s, such that a limited thermal budget is obtained. For forming an ohmic contact to a compound semiconductor material, for example to a III-V compound semiconductor material, typically a temperature below 600° C., preferably in the range 400° C. to 600° C. may be applied for a limited time range, e.g. 10 s to 5 minutes, preferably 10 s to 60 s. Rapid thermal processing (RTP) is used to apply these temperatures for a limited period such that the overall thermal budget is limited.

During manufacturing of semiconductor devices using a semiconductor compound material or germanium, impurities may diffuse from the semiconductor material to the substrate, which may disturb the functioning of the semiconductor device. Hence, a method for gettering impurities at reduced thermal budget, i.e. at reduced temperatures and/or during reduced time periods is needed.

Therefore, certain embodiments relate to a method for removing impurities, e.g. metal impurities, from at least one semiconductor device layer during manufacturing of a semiconductor device using such a semiconductor device layer, the at least one semiconductor device layer comprising a compound semiconductor material and/or germanium and each heating process performed during the manufacturing of the semiconductor device after provision of the at least one semiconductor device layer having a low thermal budget determined by temperatures equal to or lower than 900° C. and time periods equal to or lower than 5 minutes, the thermal budget of a heating process being defined by the integral of the temperature over the time period of the heating process. The method comprises providing a germanium gettering layer with a higher solubility for the impurities, e.g. metal impurities, than the semiconductor device layer, the germanium gettering layer being provided at least partly in direct or indirect contact with the at least one semiconductor device layer, such that impurities, e.g. metal impurities can diffuse from the at least one semiconductor device layer to the germanium gettering layer.

The thermal budget defines the total amount of thermal energy transferred to a substrate comprising the semiconductor device during the given heating process. The thermal budget is proportional to the temperature and duration of the heating process. A low thermal budget is possible even at a very high temperature if the time period of the heating process very short (can be as short as few seconds). For example, when using laser annealing the temperature may be as high as 900° C. but the time period may only be in the order of tens of nanoseconds to a few microseconds.

A thermal budget is characterized not only by its total amount of thermal energy provided, but also by the maximum temperature obtained and by the speed at which the temperature is varied during the heating process. In particular the cooling rate, i.e. the rate at which the temperature is decreased from this maximum temperature, is a parameter in the gettering process according to embodiments of the present invention. Whereas the thermal budget determines the characteristics of the overall diffusion process, the solubility of an impurity in the germanium gettering layer depends on the maximum temperature obtained. The faster the temperature is lowered once the maximum temperature is obtained, i.e. a high cooling rate, the more likely meta-stable phases present in the germanium gettering layer such as distributions of point defects such as vacancies and/or interstitials, distributions of metals, are frozen, i.e. the temperature is lowered that fast that these distributions will not change. Hence different parameters of the heating process such as thermal budget, maximum temperature and cooling rate are selected in view of the desired gettering efficiency for a particular semiconductor device layer, particular impurities, e.g. metal impurities, to be gettered and a particular germanium gettering layer.

With "in direct contact" is meant that no other layers are in between the germanium gettering layer and the semiconductor device layer and that impurities can go directly from the germanium gettering layer to the semiconductor device layer. With "in indirect contact" is meant that at least one intermediate layer is present.

Even at reduced thermal budget, i.e. at reduced temperatures and/or reduced time period of the heating process, germanium offers a higher solubility and diffusivity of metals such as e.g. Fe, Cu, Ni, Co, Mn compared to compound semiconductor materials. Therefore germanium can be used to getter impurities, e.g. metal impurities from compound semiconductor materials even at lower temperatures (see further). At these temperatures, diffusion of germanium into these compound semiconductor materials, which results in an unwanted doping of the compound semiconductor materials, can also be reduced or even avoided at such lower temperatures. Once the impurities, e.g. metal impurities have diffused into the germanium gettering layer, they remain in the gettering layer when the substrate is cooled down, because the solubility of the impurities in germanium decreases with temperature (see "Brother Silicon, Sister Germanium", Jan Vanhellemont, Eddy Simoen, Electrochemical Society conference (ECS), Cancun Oct. 2, 2006 and in Journal of Electrochemical. Society. 154 (2007) H572. Although this would make a germanium layer less useful, unless at the expense of a tight contamination control, as a device layer, such engineered germanium layer can be used as gettering layer in the manufacturing of semiconductor processes. At lower temperatures, as shown in the above document "Brother Silicon, Sister Germanium", the difference in gettering efficiency between Ge on the one hand and Si or compound semiconductor materials on the other hand, becomes more pronounced.

According to embodiments of the present invention, the difference in solubility and diffusivity with respect to the impurities, e.g. metal impurities can be exploited by choosing an appropriate, low thermal budget to getter impurities, e.g. metal impurities in the germanium gettering layer.

An advantage of a method according to embodiments of the invention is that even at a low thermal budget, the germanium gettering layer is able to getter impurities, e.g. metal impurities from the at least one semiconductor device layer and to keep them from going back to the at least one semiconductor device layer. Keeping the impurities, e.g. metal impurities may be obtained by segregation gettering. Segregation gettering occurs when the solubility of impurities, e.g. metal impurities is much higher in the germanium gettering layer than in the semiconductor device layer. This may be obtained by making the germanium layer such that it has a higher dopant concentration than the semiconductor device layer. The impurities, e.g. metal impurities diffuse towards the layer with highest solubility for these impurities, i.e. towards the germanium gettering layer, and stay there because of the higher solubility. Furthermore, when decreasing the temperature after impurities, e.g. metal impurities, have been gettered by the germanium gettering layer, i.e. when cooling down the substrate 2 after processing of the semiconductor device 1, the mobility of the impurities, e.g. metal impurities decreases as well, such that they will be kept in the germanium gettering layer. By cooling down, the impurities, e.g. metal impurities may precipitate. Precipitation may be obtained because, according to embodiments of the invention where dislocations are present in the germanium gettering layer, the impurities, e.g. metal impurities 'attach' to these dislocations. According to other embodiments of the invention, precipitation may be obtained because metal impurities form germanide clusters in the germanium gettering layer.

According to embodiments of the invention, no dislocations need to be present in the germanium gettering layer for obtaining a gettering effect. The germanium gettering layer thus may be dislocation free. For example, good gettering may be obtained even with epitaxial germanium layers. However, according to embodiments of the invention, the gettering efficiency may be increased by providing such dislocations in the germanium gettering layer (see further).

According to embodiments of the invention, the gettering efficiency of the germanium gettering layer can be modulated. In this way, the gettering efficiency of the germanium gettering layer can be increased. Increasing the gettering efficiency of the gettering layer means that the number of impurities that can be gettered per gettering site in the gettering layer is increased. Increasing the gettering efficiency of the germanium gettering layer can be done in different ways.

A first way to increase the gettering efficiency of the germanium gettering layer may be by doping the germanium gettering layer. R. N. Hall et al disclose in "Diffusion and solubility of Copper in Extrinsic and Intrinsic Germanium, Silicon and Gallium Arsenide", in particular in section 6.1, the solubility enhancement of copper in doped germanium. The germanium layer may be highly doped such that it has a dopant concentration of higher than $1e17$ $cm^{-3}$, for example higher than $1e18$ $cm^{-3}$. The germanium gettering layer can be highly doped with either p-type dopants such as e.g. Ga, B, In, with n-type dopants such as e.g. Sb, As, P, or with neutral impurities such as e.g. O, C, Sn, Pb. These p- or n-type dopants and/or neutral impurities can be incorporated in the germanium gettering layer by any suitable way known to a person skilled in the art, for example by using ion implantation or plasma doping. Alternatively, the germanium gettering layer can be in-situ doped, i.e. the p- or n-type dopants and/or neutral impurities can be incorporated into the germanium gettering layer when forming this layer.

Another way to increase the gettering efficiency of the germanium gettering layer may be by creating strain in the gettering layer, for example by locally creating strain in the gettering layer by creating dislocations, as already mentioned above. Impurities or dopants are likely to be attracted by an elastic-strain field which is associated with such dislocations, hereby forming a so-called Cottrell atmosphere.

Still another way to increase the gettering efficiency of the germanium gettering layer may be achieved by creating lattice defects in the germanium gettering layer, e.g. by implantation of He, H or inert species such as Ar therein, or by forming small voids in the gettering layer, e.g. by implantation of H and/or He atoms therein.

Furthermore, amorphous germanium may have an increased number of gettering sites including voids and/or hydrogen atoms. Microcrystalline or polycrystalline germanium may have an increased number of gettering sites including grain boundaries.

The thickness of the germanium getter layer required for a particular application can be determined as a function of the number of impurities present in the at least one semiconductor device layer and thus as a function of the number of impurities that has to be gettered. According to the 'International Technology Roadmap report ITRS roadmap 2005 Front End Process' the number of mobile ions allowable in device layers in order to obtain good performance of the semiconductor device should be less than $1e10$ $cm^{-2}$. Depending on the dopant or impurity concentration, the germanium gettering layer should be capable of gettering at least $1e11$ $cm^{-2}$, for example $1e12$ $cm^{-2}$ ions, such that the number of ions in the device layer is reduced to $1e10$ $cm^{-2}$ or less. If a device layer has, for example, $1e11$ $cm^{-2}$ (or $1e18$ $cm^{-3}$) impurities, this number of impurities may have to be absorbed by the germanium gettering layer.

If it is assumed that there is one gettering site present for every impurity in the semiconductor device layer, the volume of the gettering layer $$V_g = t_g \cdot A_g \quad (1)$$

with $t_g$ the thickness of the gettering layer and $A_g$ the area of the gettering layer, may be equal to the volume of the semiconductor device layer to be gettered. The volume of the semiconductor device layer to be gettered may be given by:

$$V_d = t_d A_d \quad (2)$$

with $t_d$ the thickness of the semiconductor device layer and $A_d$ the area of the semiconductor device layer.

However, by using one of the ways for improving the gettering efficiency as described above, the volume $V_g$ of the germanium gettering layer can be decreased proportional to the increased gettering efficiency, e.g. proportional to the number of impurities to be gettered per gettering site. If, for example, the impurities are gettered at dislocation sites, a 100 nm thick germanium gettering layer having $4e8$ $cm^{-2}$ dislocations, each dislocation being able to getter about 250 impurities, could getter up to $1e11$ $cm^{-2}$ impurities.

According to embodiments of the invention, the volume $V_g$ of the germanium gettering layer can also be increased by making the area $A_g$ of the germanium gettering layer larger than the area $A_d$ of the semiconductor device layer. As will be described in further embodiments of the invention, the germanium gettering layer may be provided, e.g. deposited, uniformly over the substrate thereby overlying device regions and isolation regions. As not all device regions on a substrate are prone to contamination, e.g. metal contamination, for example because only in selected device regions a device layer comprising a compound semiconductor material or germanium is present, a germanium gettering region may, in embodiments of the present invention, only be provided adjacent to such selected device regions. A germanium gettering layer can, in these cases, be formed adjacent to the device region which comprises or will comprise a compound semiconductor material or germanium. Such localized germanium gettering sites can, for example, be formed by patterning the formed germanium gettering layer.

According to embodiments of the invention, the germanium gettering layer may at least partly be in direct contact with the semiconductor device layer to be gettered. However, according to other embodiments of the invention, at least one additional intermediate layer may be present in between the gettering layer and the semiconductor device layer as long as the impurities, e.g. metal impurities can diffuse from the semiconductor device layer to the germanium gettering layer through the at least one additional intermediate layer without being substantially gettered, preferably without being gettered, in the at least one intermediate layer.

Hereinafter, the present invention will be discussed by means of different embodiments. It has to be understood that these are not intended to limit the invention in any way.

Figure 1B:
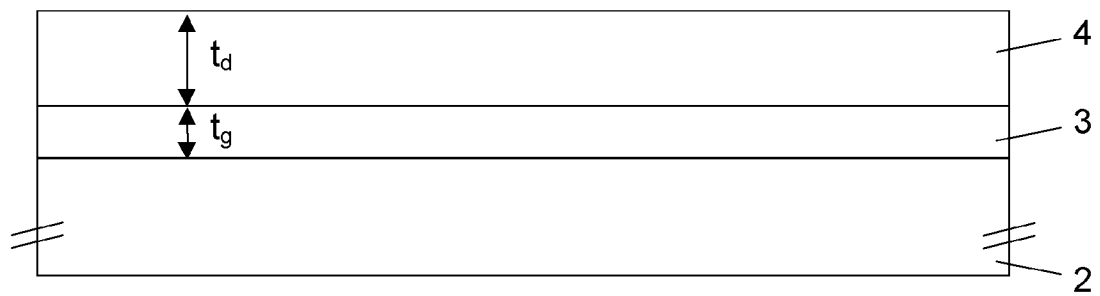
Figure 1C:
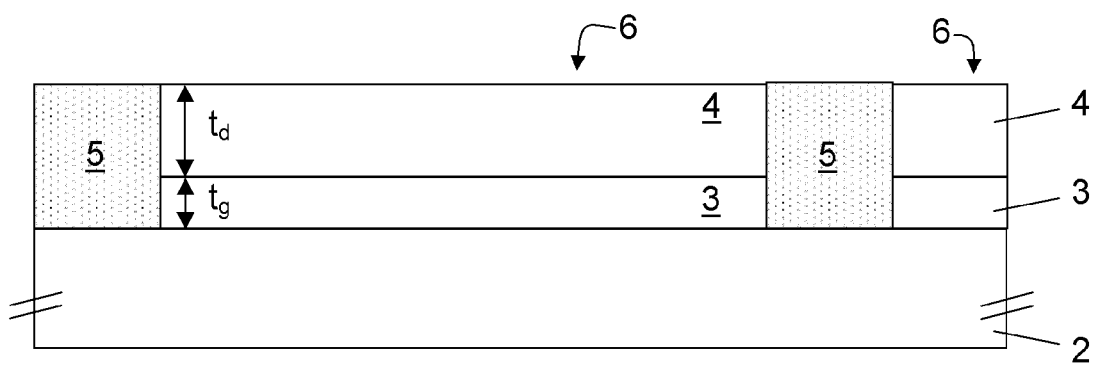

A first embodiment of a method according to the present invention is illustrated in FIGS. 1a to 1c.

In a first process, as illustrated in FIG. 1a a substrate 2 is provided. The substrate 2 may, according to embodiments of the present embodiment, be a semiconductor wafer, e.g. a silicon wafer, or may be semiconductor wafer having a dielectric cover layer. Onto the substrate 2 a germanium gettering layer 3 may be provided having a thickness $t_g$. The gettering layer 3 may for example be formed using known semiconductor process technology, such as chemical vapor deposition (CVD) or any other suitable deposition technique. The thickness $t_g$ of the gettering layer 3 may be less than 100 nm.

As shown in FIG. 1b a semiconductor device layer 4 may then be provided on the germanium gettering layer 3. The semiconductor device layer 4 can be provided using known semiconductor process technology, such as for example CVD or any other suitable deposition technique. The semiconductor device layer 4 has a thickness $t_d$, which may be the same as or larger than the thickness $t_g$ of the gettering layer 3. The thickness $t_d$ of the semiconductor device layer 4 may be higher than 5 nm, for example higher than 10 nm. The semiconductor device layer 4 may comprise a compound semiconductor material, for example a III-V or II-VI compound semiconductor material or germanium. In case the semiconductor device layer 4 is a germanium layer the properties of the germanium gettering layer 3 should be modulated such that the diffusivity and solubility of impurities, e.g. of metal impurities, in the germanium gettering layer 3 are higher than the diffusivity and solubility of impurities in the germanium device layer 4. As disclosed above this difference in diffusivity and/or solubility can, for example, be obtained by doping the germanium gettering layer 3 such that it has a higher doping concentration than the germanium device layer 4, thereby creating more defects, or by any other way to increase the gettering efficiency of the germanium gettering layer 3, for example as disclosed above.

In a next process, as illustrated FIG. 1c, isolation regions 5 may be formed to isolate neighboring device regions 6 from each other. With device regions 6 is meant regions on the substrate 2 where a device will be formed. The isolation zones 5 may, for example, be shallow trench isolation (STI) zones or thermally grown field oxide (LOCOS—Local Oxidation of Silicon) regions. However, STI zones are preferred over LOCOS regions as they can be formed in a smaller dimension than that of the LOCOS regions, which allows the reduction of the device dimensions, so that device density on the substrate 2 can be increased. Therefore, in the following description, only STI zones 5 are further considered, but it should be understood that the embodiment includes the process processes described below carried out with other isolation zones 5, such as for example LOCOS regions as well.

According to embodiments of the present invention the substrate 2 may be provided with STI zones 5. STI zones 5 may be formed by initially creating a shallow trench in the semiconductor device layer 4 and the germanium gettering layer 3, e.g. by a conventional photolithographic and anisotropic etch process such as a dry etch process, e.g. reactive ion etching (RIE) procedure, using e.g. $Cl_2$ as etchant. After removal of the photoresist pattern used for shallow trench definition, e.g. by plasma oxygen ashing and careful wet cleans, an insulating layer such as a silicon oxide layer may be deposited, for example by a low pressure chemical vapor deposition (LPCVD) procedure or by a plasma enhanced chemical vapor deposition (PECVD) procedure or other procedure, such that the shallow trenches are completely filled. Removal of the insulating material, silicon oxide in the example given, from regions other than inside the shallow trenches may be accomplished using any suitable technique such as either a chemical mechanical polishing (CMP) procedure, or via a RIE procedure using a suitable etchant, resulting in insulator filled STI zones 5.

If, according to other embodiments of the invention, instead of STI zones 5, LOCOS isolation zones would be provided in semiconductor device layer 4 and the germanium gettering layer 3, they may be formed via initially forming an oxidation resistant mask, such as silicon nitride, then exposing regions of the semiconductor device layer 4 and of the germanium gettering layer 3 not protected by the silicon nitride masking pattern, to a thermal oxidation procedure. After formation of the LOCOS region, the oxidation resistant mask is removed.

In the device regions 6 semiconductor devices comprising at least one semiconductor device layer comprising a compound semiconductor material or germanium can be fabricated using known semiconductor process technology. According to embodiments of the present invention, even the limited thermal budget applied during such fabrication process will be sufficient for impurities present in the semiconductor device layer 4, whether present before or captured during the semiconductor device fabrication process, to diffuse into the germanium gettering layer 3. After the impurities have diffused into the germanium gettering layer 3, they will remain there, as was already mentioned before.

The gettering efficiency of the germanium gettering layer 3 can be increased for example using the ways described above.

Figure 2A:
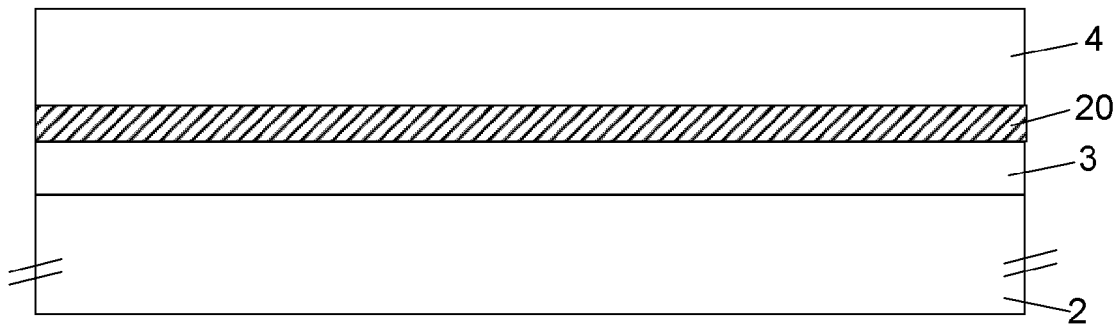
FIGS. 2a and 2b illustrate cross-sections of a semiconductor device formed by a method according to embodiments of the invention.
Figure 2B:
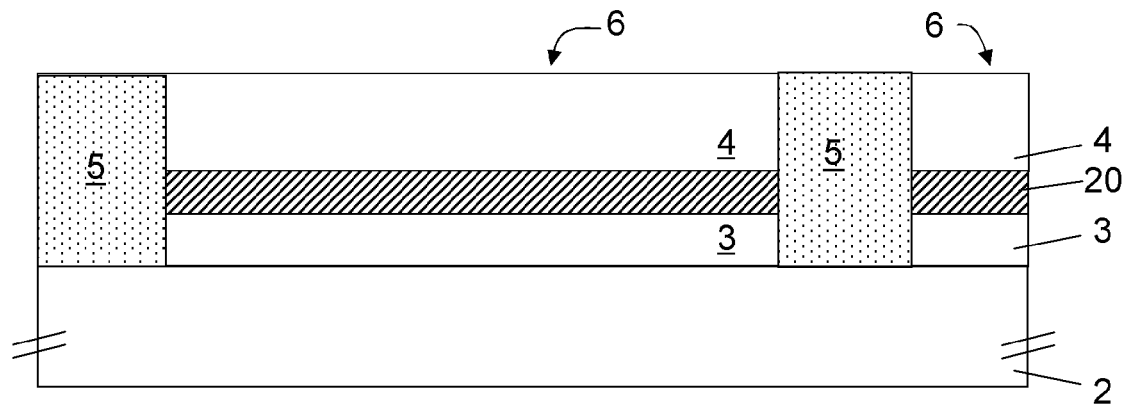

According to other embodiments of the invention, the germanium gettering layer 3 may be in indirect contact with the semiconductor device layer 4. In other words, at least one intermediate layer may be present in between the gettering layer 3 and the semiconductor device layer 4 as long as the impurities, e.g. metal impurities, can diffuse from the semiconductor device layer 4 to the germanium gettering layer 3 through the at least one additional intermediate layer without being substantially gettered, preferably without being gettered, in the at least one intermediate layer. An example of the present embodiment is illustrated in FIGS. 2a and 2b. Onto the substrate 2, a germanium gettering layer 3 is provided. Onto the germanium gettering layer 3 an intermediate layer 20 may be provided (see FIG. 2a). The intermediate layer 20 may, for example, be a dielectric layer, e.g. an oxide layer. Similar to the embodiments described with respect to FIG. 1c, isolation regions 5 may be formed to isolate neighboring device regions 6 from each other (see FIG. 2b). The isolation zones 6 may, similar as described above, be STI zones or LOCOS zones. According to this embodiments, impurities, e.g. metal impurities from the semiconductor device layer 4 may be gettered in the germanium gettering layer 3 through the intermediate layer 20.

Figure 3:
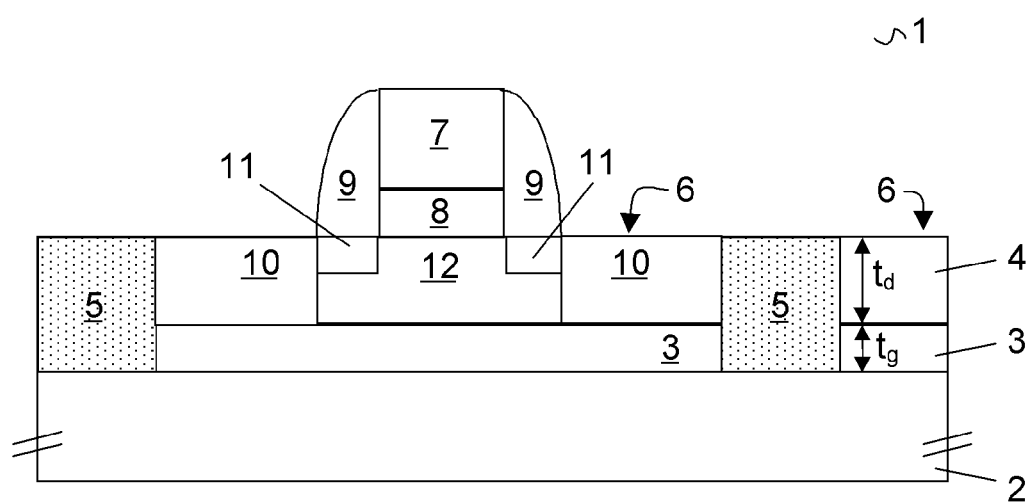
FIG. 3 shows a cross-section of a semiconductor device formed by a method according to embodiments of the invention.

Another embodiment of the present invention is illustrated in FIG. 3. A schematic cross-section of a MOSFET device 1 according to embodiments of the invention is shown. The MOSFET device 1 may be fabricated in device regions 6 on the substrate 2. The planar MOSFET device shown in FIG. 3 comprises a gate stack formed of a gate dielectric 8 and a gate electrode 7. In the semiconductor device layer 4 lowly doped junction regions 11 can be formed which are aligned to the gate stack 7, 8. This may be done by any suitable technique known by a person skilled in the art. Sidewall spacers 9 may be formed against sidewalls of the gate stack 7, 8. These sidewall spacers 9 may be formed of a dielectric material such as e.g. silicon oxide, silicon nitride, silicon carbide, silicon nitride or a combination thereof. Aligned to the sidewall spacers 9 highly doped junction regions 10 may be formed in the semiconductor device layer 4. The highly doped junction regions 10 and lowly doped junction regions 11 may constitute source and drain regions formed on opposite sides of a channel region 12 of the MOSFET device 1.

In close contact with the device layer 4 comprising the channel region 12 and the source/drain regions 10, 11 a germanium gettering layer 3 according to embodiments of the description is present. According to the present embodiment, the germanium gettering layer 3 is present in between the substrate 2 and the semiconductor device layer 4 and is in direct contact with the semiconductor device layer 4 in the device regions 6. According to the present embodiment, the channel region 12 and/or the source/drain regions 10, 11 are formed in the semiconductor device layer and may thus comprise a compound semiconductor material, for example a III-V or a II-VI compound semiconductor material, and/or germanium.

Similar to the first embodiment and as described earlier, the gettering efficiency of the germanium gettering layer 3 can be increased using a method as described above.

The device illustrated in FIG. 3 can be fabricated starting from a substrate 2 comprising a germanium gettering layer 3 and a semiconductor device layer 4 and with isolation regions 5 to define device regions 6 as illustrated in FIG. 1c. The processes for forming this structure may be similar to the ones described in the paragraphs describing FIGS. 1a to 1c. Formation of the gate structure 7, 8, the sidewall spacers 9 and the highly and lowly doped junction regions 10, 11 may be performed by techniques used in standard semiconductor processing which are known by a person skilled in the art.

Figure 4:
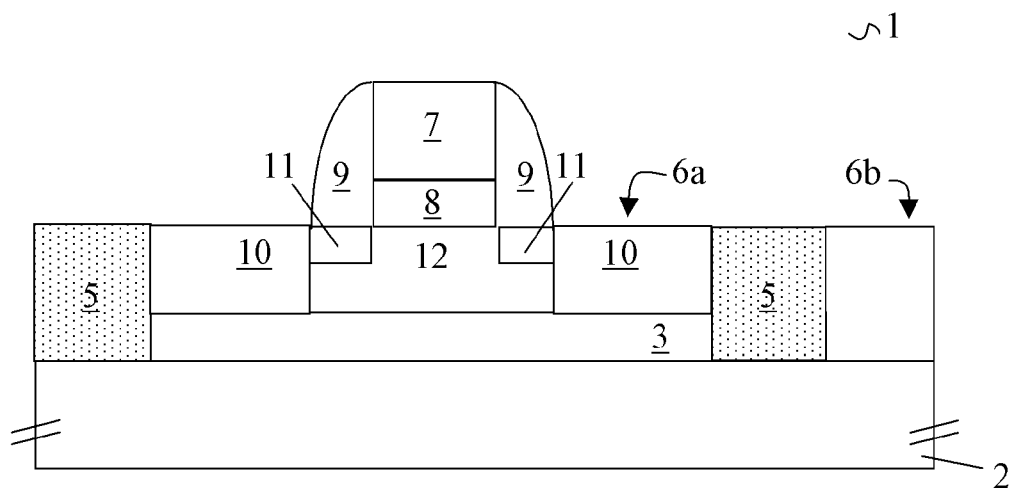
FIG. 4 shows a cross-section of a semiconductor device formed by a method according to embodiments of the invention.

According to another embodiment of the invention which is illustrated in FIG. 4, instead of providing a germanium gettering layer 3 over the entire substrate 2, a germanium gettering layer 3 may be provided only in selected regions 6a of the substrate 2. The germanium gettering layer 3 may then preferably be formed in those regions which are prone to contamination, e.g. metallic contamination. This may be the regions 6a where a device is to be formed which comprises at least one semiconductor device layer 4 comprising a compound semiconductor material or germanium. In the device 1 illustrated in FIG. 4 the device region 6a on the left side of the isolation zone 5 may comprises a germanium gettering layer 3 according to embodiments of the present invention which is in direct contact with a semiconductor device layer 4 comprising a compound semiconductor material, for example a III-V compound semiconductor material and/or germanium. During fabrication of the semiconductor device 1, impurities, for example fast diffusing metal impurities such as Fe, will diffuse into the germanium gettering layer 3. The device region 6b on the right hand side of the isolation zone 5 does not comprise a semiconductor device layer 4 and hence, is not provided with a germanium gettering layer 3.

Figure 5:
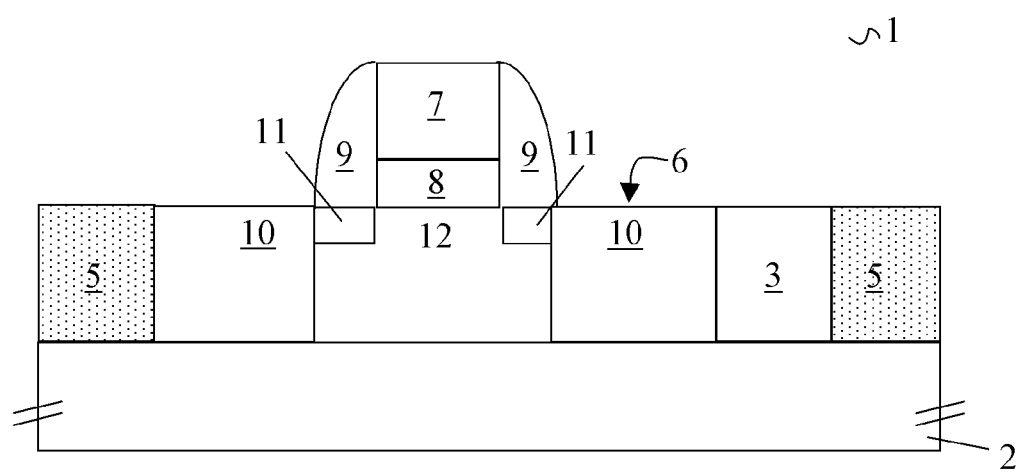
FIG. 5 shows a cross-section of a semiconductor device formed by a method according to embodiments of the invention.

Instead of having the germanium gettering layer 3 underneath the semiconductor device layer 4, according to alternative configurations, the germanium gettering layer 3 may also be located at other locations with respect to the semiconductor device layer 4. An example of such an alternative configuration is illustrated in FIG. 5. According to this embodiment, the germanium gettering layer 3 may be formed in a trench adjacent to and in direct contact with the semiconductor device layer 4 which comprises a compound semiconductor material, for example a III-V or II-VI compound semiconductor material and/or germanium. Impurities, for example metal impurities, from the channel region 12 and/or the source/drain regions 10, 11 which are formed in the semiconductor device layer 4 can diffuse into the germanium gettering layer 3 during fabrication of the device 1. According to the present embodiment, the germanium gettering layer 3 may thus be formed in between an isolation region 5 and the semiconductor device layer 4. It has to be noted that the gettering efficiency of the germanium gettering layer 3 of the device 1 illustrated in FIG. 5 may be less than that of the germanium gettering layer 3 of the device 1 illustrated in FIG. 4. This is because, due to the limited thermal budget available as described above, the distance over which impurities, e.g. metal impurities can diffuse is limited. Hence, the further the impurities, e.g. metal impurities, have to diffuse to get to the germanium gettering layer 3, the lower the gettering efficiency of the germanium gettering layer 3 may be. Furthermore, the volume of the germanium gettering layer 3 in the device 1 illustrated in FIG. 5 is smaller than the volume of the germanium gettering layer 3 of the device 1 illustrated in FIG. 4, which also may decrease its gettering efficiency.

Similarly to the first and second embodiments and as described earlier, the gettering efficiency of the germanium gettering layer 3 can be increased using any of the methods as described above.

Figure 6:
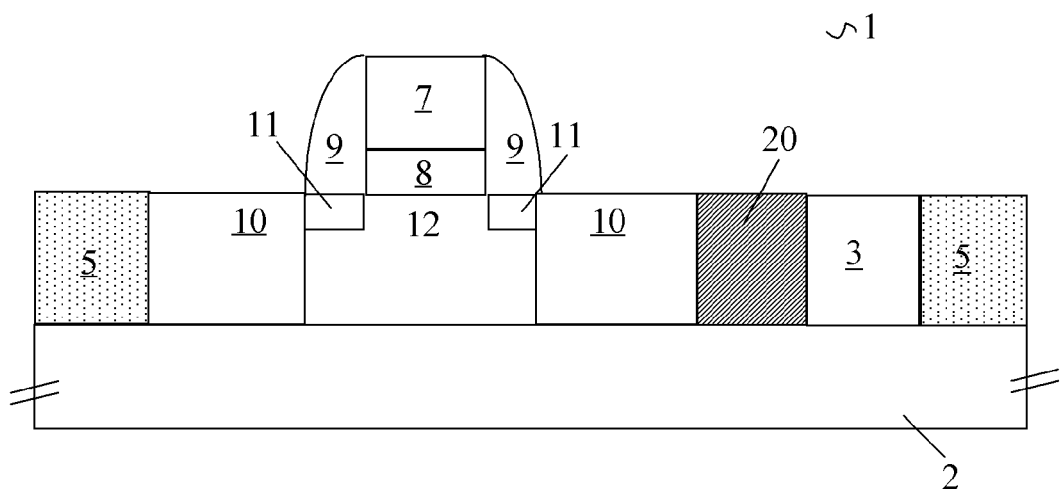
FIG. 6 illustrate a cross-section of a semiconductor device formed by a method according to embodiments of the invention.

According to embodiments of the invention and as illustrated in FIG. 6, at least one intermediate layer 20 may be present in between the semiconductor device layer 4 in which the active region 12, and source and drain regions 10 of the device 1 are formed, and the germanium gettering layer 3. The at least one intermediate layer may, for example, be a dielectric layer, e.g. an oxide layer. According to this embodiment, impurities, e.g. metal impurities from the semiconductor device layer 4 may be gettered in the germanium gettering layer 3 through the intermediate layer 20.

Figure 7A:
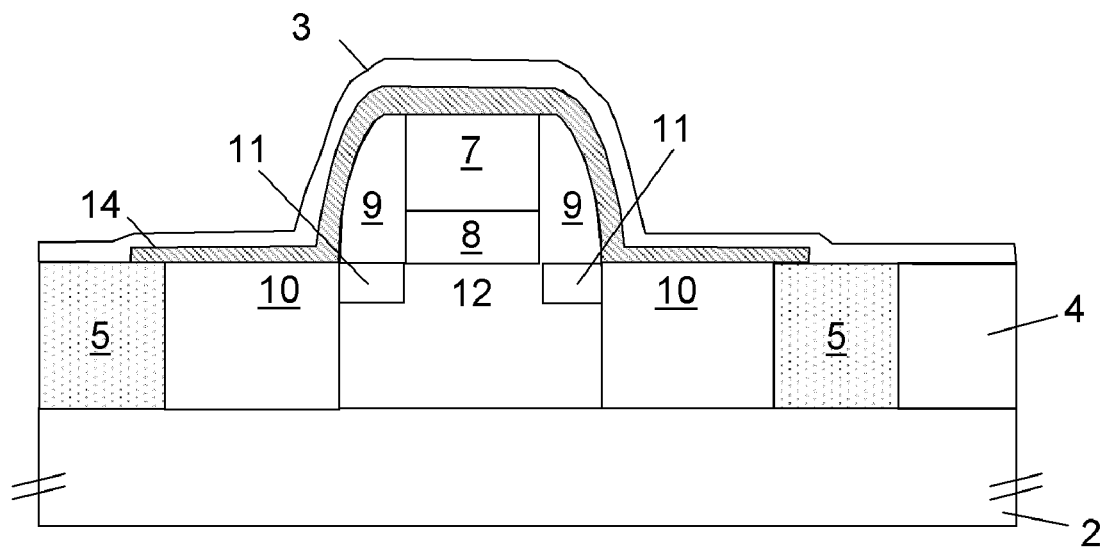
FIGS. 7a and 7b show subsequent processes in a method according to an embodiment of the present invention.
Figure 7B:
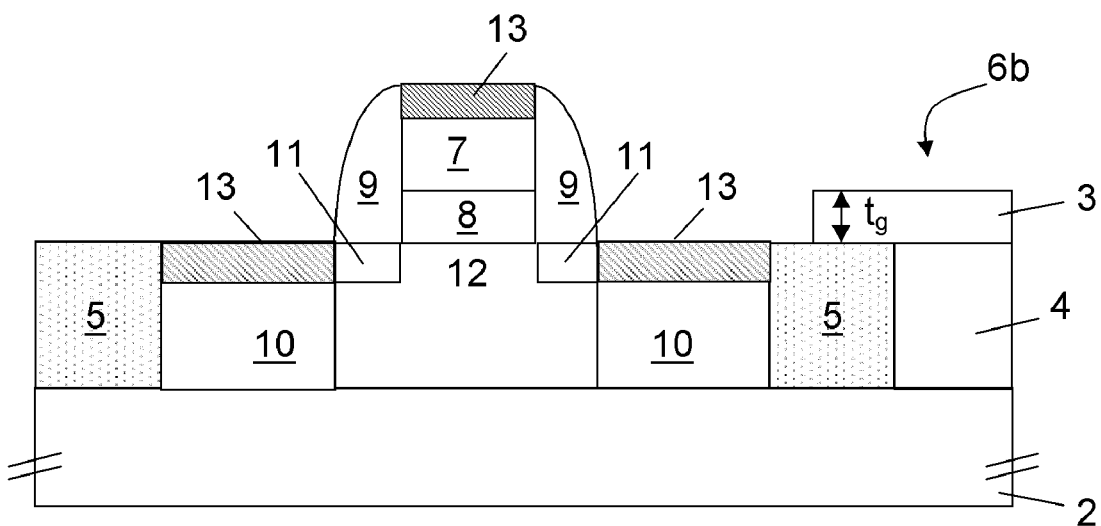

FIGS. 7a and 7b illustrate another embodiment of the present invention. After forming the source/drain regions 10, 11 in semiconductor device layer 4 comprising a compound semiconductor material, e.g. a III-V or II-VI compound semiconductor material, or germanium, ohmic contacts, e.g. Ni—Ge—Au ohmic contacts, may need to be formed at least to the source/drain regions 10. A method for forming such Ni—Ge—Au ohmic contacts is described in U.S. Pat. No. 5,309,022. Starting from the device 1 as illustrated in FIG. 3 but without the germanium gettering layer 3 being present in between the substrate 2 and the semiconductor device layer 4, a metal layer 14 may be deposited overlying at least the source/drain regions 10 of the device 1 (see FIG. 7a). The metal of this layer 14 may, for example, be Au, Ni or Al. Overlying this metal layer 4, a germanium gettering layer 3 may be deposited over the whole substrate 2. This germanium gettering layer 3 may, according to the present embodiment, be an amorphous germanium layer 3. The gettering efficiency of the germanium gettering layer 3 can be increased using the means disclosed in previous paragraphs.

The stack formed by the source/drain regions 10 comprising a compound semiconductor material and/or germanium, the metal layer 14 and the germanium gettering layer 3 may then be heated to form a low resistive metal-germanide 13 at the source/drain regions 10 and at the gate electrode 7 (see FIG. 7b). After forming the contacts 13 the unreacted germanium can be patterned to form gettering regions 3 adjacent to other selected device regions 6b of the device 1 which comprise a compound semiconductor material and/or germanium. The germanium gettering layer 3 can thus be used as gettering layer for the device layer 4 of such selected device region 6b. The patterned germanium layer 3 can remain on the processed substrate during subsequent processing of the semiconductor device and even remain part of the finished device. Alternatively, the patterned germanium layer can be removed later on in the process of fabricating the semiconductor device.

According to other embodiments of the invention, a germanium gettering layer 3 may be formed in direct or in indirect contact with the semiconductor device layer 4 and may then be removed afterwards, i.e. may be removed still during the manufacturing of the semiconductor device 1 or after the manufacturing of the semiconductor device 1.

Figure 8A:
FIGS. 8a to 8c show subsequent processes in a method according to an embodiment of the present invention.
Figure 8B:
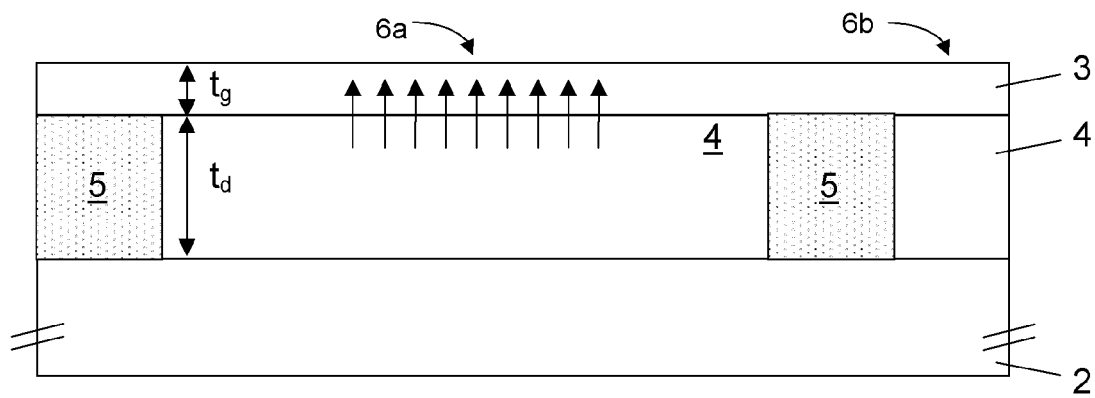
Figure 8C:
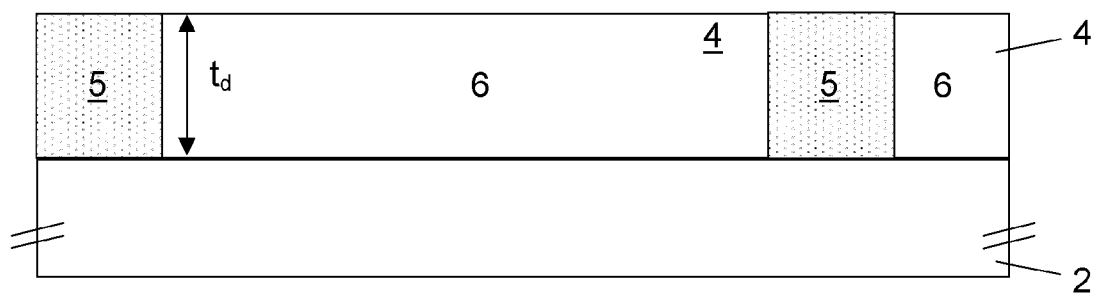

FIGS. 8a-8c illustrate a method for creating a temporary germanium gettering layer 3 in close proximity with a semiconductor device layer 4, i.e. in direct or in indirect contact with the semiconductor device layer 4 comprising a compound semiconductor material, for example a III-V or II-VI compound semiconductor material, and/or germanium, when fabricating such device layers 4.

As shown in FIG. 8a a substrate 2 is provided. This substrate 2 can be a semiconductor wafer, e.g. a silicon wafer or can be a semiconductor wafer having a dielectric cover layer. Onto this substrate 2 a semiconductor device layer 4 is formed. The semiconductor device layer 4 can be formed using known semiconductor process technology such as e.g. CVD or any other suitable deposition technique. The semiconductor device layer 4 has a thickness $t_d$. The semiconductor device layer 4 comprises a compound semiconductor material, e.g. a III-V or II-VI compound semiconductor material, and/or germanium. As shown in FIG. 6a isolation regions 5 can be formed to isolate neighboring device regions 6a, 6b from each-other. The isolation regions 5 may be formed using STI whereby grooves, formed at least in the device layer 4, are filled with one or more dielectric materials, as was described with respect to earlier embodiments. According to other embodiments of the invention, and as already mentioned before, the isolation zones may also be formed by LOCOS regions.

As shown in FIG. 8b a germanium gettering layer 3 is deposited at least over those device regions 6a, 6b of the substrate 2 which comprise a semiconductor device layer 4 comprising a compound semiconductor material and/or germanium. The germanium gettering layer 3 may be provided over the complete substrate 2. The germanium gettering layer 3 has a thickness $t_g$. The thickness $t_g$ of the germanium gettering layer 3 may, according to the present embodiment, be between 10 nm and 2 µm, for example between 100 nm and 1 µm. The gettering layer 3 may be formed using any suitable deposition technique known by a person skilled in the art, such as e.g. chemical vapor deposition (CVD). According to embodiments of the invention, an amorphous or polycrystalline germanium layer may be formed because such layers have a higher gettering efficiency as was already indicated above. When the semiconductor device layer 4 is a germanium layer as well, the properties of the germanium gettering layer 3 should be modulated such that the diffusivity and solubility of impurities, for example metal impurities, in the germanium gettering layer 3 is higher than in the germanium device layer 4. As disclosed above this difference in diffusivity and/or solubility can for example be obtained by having the germanium gettering layer 3 higher doped than the germanium device layer 4 such that the germanium gettering layer 3 comprises more defects than the germanium device layer 4. Alternatively, any other means to increase the gettering efficiency of the germanium gettering layer 3 as disclosed above may be used.

Next, a heat treatment process, also referred to as thermal anneal, may be performed to let impurities, for example metal impurities, present in the semiconductor device layer 4 in the device region 6 diffuse from the semiconductor device layer 4 into the germanium gettering layer 3 as indicated by the arrows in FIG. 8b. This thermal anneal may be performed at a temperature of between 400° C. and 600° C. for a time period of between 10 s and 5 minutes. For example, the thermal anneal may be performed at a temperature of 600° C. for a time period of 60 s. For this thermal anneal process, rapid thermal processing (RTP) may be applied to provide an optimal thermal budget for the gettering process.

If the semiconductor device layer 4 is already doped, then the thermal budget of the gettering process may be selected such that only the impurities will diffuse from the semiconductor device layer 4 into to the germanium gettering layer 3 and not the dopant elements. At a certain temperature, diffusion of impurities e.g. metal impurities and of dopant elements may differ by at least one order of magnitude. Dopant elements will therefore diffuse much slower than the impurities, e.g. metal impurities. Taking this difference in diffusivity and solubility into account, the thermal budget of the gettering process may be selected such that at a the selected temperature, only the impurities, e.g. metal impurities and not the dopant elements will diffuse towards and into the germanium gettering layer 3 and at the same time having the dopant concentration profile remaining within the specifications required by the device to be fabricated.

Similarly as described for the above embodiments, the gettering efficiency of the germanium gettering layer 3 can be increased using the methods as described above.

After the gettering process illustrated in FIG. 8b, the germanium gettering layer 3 comprising the gettered impurities may be selectively removed from the substrate 2 using known semiconductor process technology (see FIG. 8c). The gettering layer 3 may for example be removed by a chemical process such as e.g. a selective etching process, or may be removed by means of a mechanical process such as e.g. CMP.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of removing impurities from at least one semiconductor device layer during manufacturing of a semiconductor device, the at least one semiconductor device layer comprising a compound semiconductor material and/or germanium, and each heating process performed during the manufacturing of the semiconductor device after provision of the at least one semiconductor layer having a low thermal budget determined by temperatures equal to or lower than about 900° C. and time periods equal to or lower than about 5 minutes, wherein the method comprises:

providing a germanium gettering layer with a higher solubility for the impurities than the semiconductor device layer, the germanium gettering layer being provided at least partly in direct or indirect contact with the at least one semiconductor device layer, such that impurities diffuse from the at least one semiconductor device layer to the germanium gettering layer.

2. The method according to claim 1, further comprising modulating gettering efficiency of the germanium gettering layer.

3. The method according to claim 2, wherein modulating gettering efficiency of the germanium gettering layer comprises doping the germanium gettering layer.

4. The method according to claim 3, wherein doping the germanium gettering layer is performed such that the germanium gettering layer has a dopant concentration of higher than about 1e17 cm$^{-3}$.

5. The method according to claim 3, wherein doping the germanium gettering layer comprises using a p-type dopant, an n-type dopant or a neutral impurity.

6. The method according to claim 2, wherein modulating gettering efficiency of the germanium gettering layer comprises creating stress in the germanium gettering layer.

7. The method according to claim 2, wherein modulating gettering efficiency of the germanium gettering layer comprises creating lattice defects in the germanium gettering layer.

8. The method according to claim 1, wherein providing a germanium gettering layer comprises providing a germanium gettering layer in indirect contact with the semiconductor device layer and wherein the method further comprises providing at least one intermediate layer in between the germanium gettering layer and the semiconductor device layer, the at least one intermediate layer being selected such that the impurities diffuse from the semiconductor device layer to the germanium gettering layer through the at least one intermediate layer.

9. The method according to claim 1, wherein providing a germanium gettering layer comprises providing a germanium gettering layer over the complete substrate.

10. The method according to claim 1, wherein providing a germanium gettering layer comprises providing a germanium gettering layer only at selected regions of the substrate.

11. The method according to claim 10, wherein providing a germanium gettering layer only at selected regions of the substrate comprises patterning a germanium gettering layer covering the complete substrate.

12. The method according to claim 1, wherein the thickness of the germanium gettering layer is between about 10 nm and 2 μm.

13. The method according to claim 12, wherein the thickness of the germanium gettering layer is less than about 100 nm.

14. The method according to claim 1, further comprising removing the germanium gettering layer after impurities have been diffused into the germanium gettering layer.

15. The method according to claim 14, wherein removing the germanium gettering layer is performed during manufacturing of the semiconductor device.

16. The method according to claim 14, wherein removing the germanium gettering layer is performed after manufacturing of the semiconductor device.

17. The method according to claim 1, wherein the compound semiconductor material is a compound semiconductor material, a II-VI compound semiconductor material, or a silicon comprising semiconductor material.

18. A semiconductor device formed by the method according to claim 1.

19. A method of forming a semiconductor device, the method comprising:
providing at least one semiconductor device layer comprising a compound semiconductor material and/or germanium; and
removing impurities from the at least one semiconductor device layer, wherein the process of removing impurities comprises:
providing a germanium gettering layer with a higher solubility for the impurities than the semiconductor device layer, the germanium gettering layer being provided at least partly in direct or indirect contact with the at least one semiconductor device layer, such that impurities diffuse from the at least one semiconductor device layer to the germanium gettering layer,
wherein each heating process performed during the manufacturing of the semiconductor device after provision of the at least one semiconductor layer has a low thermal budget determined by temperatures equal to or lower than about 900° C. and time periods equal to or lower than about 5 minutes.

20. The method according to claim 19, the semiconductor device being a transistor, the method further comprising:
forming a first and second main electrode in the semiconductor device layer; and
providing a control electrode structure comprising a dielectric and a control electrode.

21. A semiconductor device formed by the method according to claim 19.

* * * * *